(12) United States Patent
Cho et al.

(10) Patent No.: US 12,159,793 B2
(45) Date of Patent: Dec. 3, 2024

(54) SUBSTRATE TREATING APPARATUS AND SUBSTRATE TREATING METHOD

(71) Applicant: SEMES CO., LTD., Cheonan-si (KR)

(72) Inventors: Min Hee Cho, Suwon-si (KR); Kyeong Min Lee, Hwaseong-si (KR); Won Young Kang, Hwaseong-si (KR); Kang Sul Kim, Hwaseong-si (KR); Tae-Keun Kim, Siheung-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 17/978,328

(22) Filed: Nov. 1, 2022

(65) Prior Publication Data

US 2023/0207338 A1 Jun. 29, 2023

(30) Foreign Application Priority Data

Dec. 28, 2021 (KR) .......................... 10-2021-0189942

(51) Int. Cl.
*H01L 21/67* (2006.01)
*H01L 21/02* (2006.01)

(52) U.S. Cl.
CPC .. *H01L 21/67051* (2013.01); *H01L 21/02052* (2013.01)

(58) Field of Classification Search
None
See application file for complete search history.

(56) References Cited

U.S. PATENT DOCUMENTS

2016/0163534 A1* 6/2016 Kaneko ............... H01L 21/0206
134/4
2020/0086360 A1* 3/2020 Yoshida ............ H01L 21/68792

FOREIGN PATENT DOCUMENTS

| KR | 10-2016-0016667 A | 2/2016 | |
| KR | 20170133265 | * 12/2017 | ............... B08B 3/04 |
| KR | 10-1874526 B1 | 7/2018 | |
| KR | 10-2019-0042524 A | 4/2019 | |
| KR | 10-2019-0069304 A | 6/2019 | |
| KR | 10-2019-0085110 A | 7/2019 | |

OTHER PUBLICATIONS

KR20170133265 English Translation, accessed on May 2023. (Year: 2017).*

* cited by examiner

*Primary Examiner* — Eric W Golightly
*Assistant Examiner* — Arlyn I Rivera-Cordero
(74) *Attorney, Agent, or Firm* — Harness, Dickey & Pierce, P.L.C.

(57) ABSTRACT

A substrate treating method including removing particles formed on a substrate by continuously performing a process of supplying a treatment liquid including a polymer and a solvent onto the substrate, forming a solidified liquid film by volatilizing the solvent in the treatment liquid, removing the solidified liquid film from the substrate by supplying a stripping liquid onto the substrate, and supplying a rinse liquid onto the substrate may be provided.

12 Claims, 12 Drawing Sheets

SUBSTRATE TREATING APPARATUS AND SUBSTRATE TREATING METHOD

CROSS-REFERENCE TO RELATED APPLICATIONS

This application claims priority to and the benefit of Korean Patent Application No. 10-2021-0189942 filed in the Korean Intellectual Property Office on Dec. 28, 2021, the entire contents of which are incorporated herein by reference.

TECHNICAL FIELD

The present invention relates to an apparatus for treating a substrate, and more particularly, to a substrate treating apparatus and a substrate treating method of treating a substrate with a liquid by supplying the liquid to the substrate.

BACKGROUND ART

In general, in order to manufacture a semiconductor device, various processes, such as a photo process, an etching process, an ion implantation process, and a deposition process, are performed. In addition, before and after these processes are performed, a cleaning process of cleaning particles remaining on the substrate is performed.

The cleaning process includes a process of supplying chemicals to a substrate that is supported by a support unit and rotates, a process of removing chemicals from the substrate by supplying a cleaning liquid, such as deionized water (DIW), to the substrate, a process of supplying an organic solvent, such as isopropyl alcohol (IPA), which has a lower surface tension than the cleaning liquid, to the substrate to substitute the cleaning liquid on the substrate with the organic solvent, and a process of removing the substituted organic solvent on the substrate.

When the above-described cleaning process is performed, particles of a certain size or more remaining on the substrate are easily removed, but efficiency of the removal of particles having a fine size is low. In addition, particles deposited on an edge region of a pattern formed on the substrate are not easily removed.

SUMMARY OF THE INVENTION

The present invention has been made in an effort to provide a substrate treating apparatus and a substrate treating method, which are capable of efficiently treating a substrate.

The present invention has also been made in an effort to provide a substrate treating apparatus and a substrate treating method, which are capable of efficiently removing particles deposited on a substrate.

The present invention has also been made in an effort to provide a substrate treating apparatus and a substrate treating method in which a treatment liquid may easily penetrate into a pattern formed on a substrate.

The object of the present invention is not limited thereto, and other objects not mentioned will be clearly understood by those of ordinary skill in the art from the following description.

An exemplary embodiment of the present invention provides a substrate treating method including removing particles formed on a substrate by continuously performing a process of supplying a treatment liquid including a polymer and a solvent onto the substrate, forming a solidified liquid film by volatilizing the solvent in the treatment liquid, removing the solidified liquid film from the substrate by supplying a stripping liquid onto the substrate; and supplying a rinse liquid onto the substrate.

According to the exemplary embodiment, the process may be performed twice.

According to the exemplary embodiment, in the second process, the treatment liquid may be supplied onto the substrate in a state in which the substrate is coated with the rinse liquid.

According to the exemplary embodiment, in the first process, the treatment liquid may be supplied to the substrate rotating at a first speed, and in the second process, the treatment liquid may be supplied to the substrate rotating at a second average speed lower than the first speed.

According to the exemplary embodiment, a rotation speed of the substrate may be changed from a third speed that is lower than the second average speed to the first speed while the treatment liquid is supplied to the substrate in the second process.

According to the exemplary embodiment, the stripping liquid in the second process may be provided with a hydrogen peroxide solution or a mixed solution of a hydrogen peroxide solution and deionized water.

According to the exemplary embodiment, the stripping liquid in the first process may be provided with deionized water.

According to the exemplary embodiment, the stripping liquid in the first process and the stripping liquid in the second process may be provided differently. According to the exemplary embodiment, the rinse liquid may be isopropyl alcohol.

According to the exemplary embodiment, the substrate may be rotated during the process of removing the particles.

Another exemplary embodiment of the present invention provides a substrate treating method, including: a prior removal operation of removing contaminants formed on the substrate; and a post removal operation of further removing residual contaminants remaining on the substrate after the prior removal operation, in which each of the prior removal operation and the post removal operation includes: a treatment liquid supply operation of supplying a treatment liquid including a polymer and a solvent onto the substrate; a liquid film formation operation of forming a liquid film by volatilizing a solvent in the treatment liquid; a stripping operation of supplying a stripping liquid onto the substrate to remove the solidified liquid film from the substrate; and a rinsing operation of supplying a rinse liquid to the substrate to clean the substrate.

According to the exemplary embodiment, the stripping liquid in the prior removal operation may be provided with deionized water, and the stripping liquid in the post removal operation may be provided with a hydrogen peroxide solution or a mixed solution of a hydrogen peroxide solution and deionized water.

According to the exemplary embodiment, the treatment liquid supply operation of the post removal operation may include supplying the treatment liquid to the substrate that is coated with the rinse liquid supplied in the prior removal operation.

According to the exemplary embodiment, in the treatment liquid supply operation of the prior removal operation, the treatment liquid may be supplied to the substrate rotating at a first speed, and in the treatment liquid supply operation of the post removal operation, the treatment liquid may be supplied to the substrate rotating at a second average speed lower than the first speed, and a rotation speed of the substrate is changed from a third speed lower than the second average speed to the first speed while the treatment liquid is supplied to the substrate.

According to the exemplary embodiment, the rinse liquid may be isopropyl alcohol.

Still another exemplary embodiment of the present invention provides a substrate treating apparatus, including: a housing having a treatment space; a support unit for supporting and rotating the substrate in the treatment space; a support unit for supporting and rotating the substrate in the treatment space; a controller for controlling the support unit and the liquid supply unit, in which the liquid supply unit includes: a treatment liquid supply nozzle for supplying a treatment liquid including a polymer and a solvent to the substrate; a first stripping liquid supply nozzle for supplying a first stripping liquid to the substrate; a second stripping liquid supply nozzle for supplying a second stripping liquid to the substrate; and a rinse liquid supply nozzle for supplying a rinse liquid to the substrate, and the controller controls the liquid supply unit so as to sequentially supply the treatment liquid, the first stripping liquid, the rinse liquid, the treatment liquid, the second stripping liquid, and the rinse liquid to the substrate, and to supply the treatment liquid to the substrate on which the rinse liquid remains.

According to the exemplary embodiment, the controller may control the support unit so that the substrate supported by the support unit rotates at a first speed while the rinse liquid is supplied, and the substrate supported by the support unit rotates at a second average speed lower than the first speed while the treatment liquid is supplied to the substrate to which the rinse liquid is supplied.

According to the exemplary embodiment, the controller may control the support unit so that a rotation speed of the substrate is changed from a third speed lower than the second average speed to the first speed while the treatment liquid is supplied to the substrate to which the rinse liquid is supplied.

According to the exemplary embodiment, the first speed may be 1500 rpm, and the third speed may be 100 rpm.

According to the exemplary embodiment, the first stripping liquid may be provided with deionized water, and the second stripping liquid may be provided with a hydrogen peroxide solution or a mixed solution of a hydrogen peroxide solution and deionized water.

According to the exemplary embodiment of the present invention, it is possible to efficiently treat a substrate.

Further, according to the exemplary embodiment of the present invention, it is possible to efficiently remove particles deposited on a substrate.

Further, according to the exemplary embodiment of the present invention, a treatment liquid may easily penetrate into a pattern formed on a substrate.

The effect of the present invention is not limited to the foregoing effects, and those skilled in the art may clearly understand non-mentioned effects from the present specification and the accompanying drawings.

DETAILED DESCRIPTION

Figure 1:
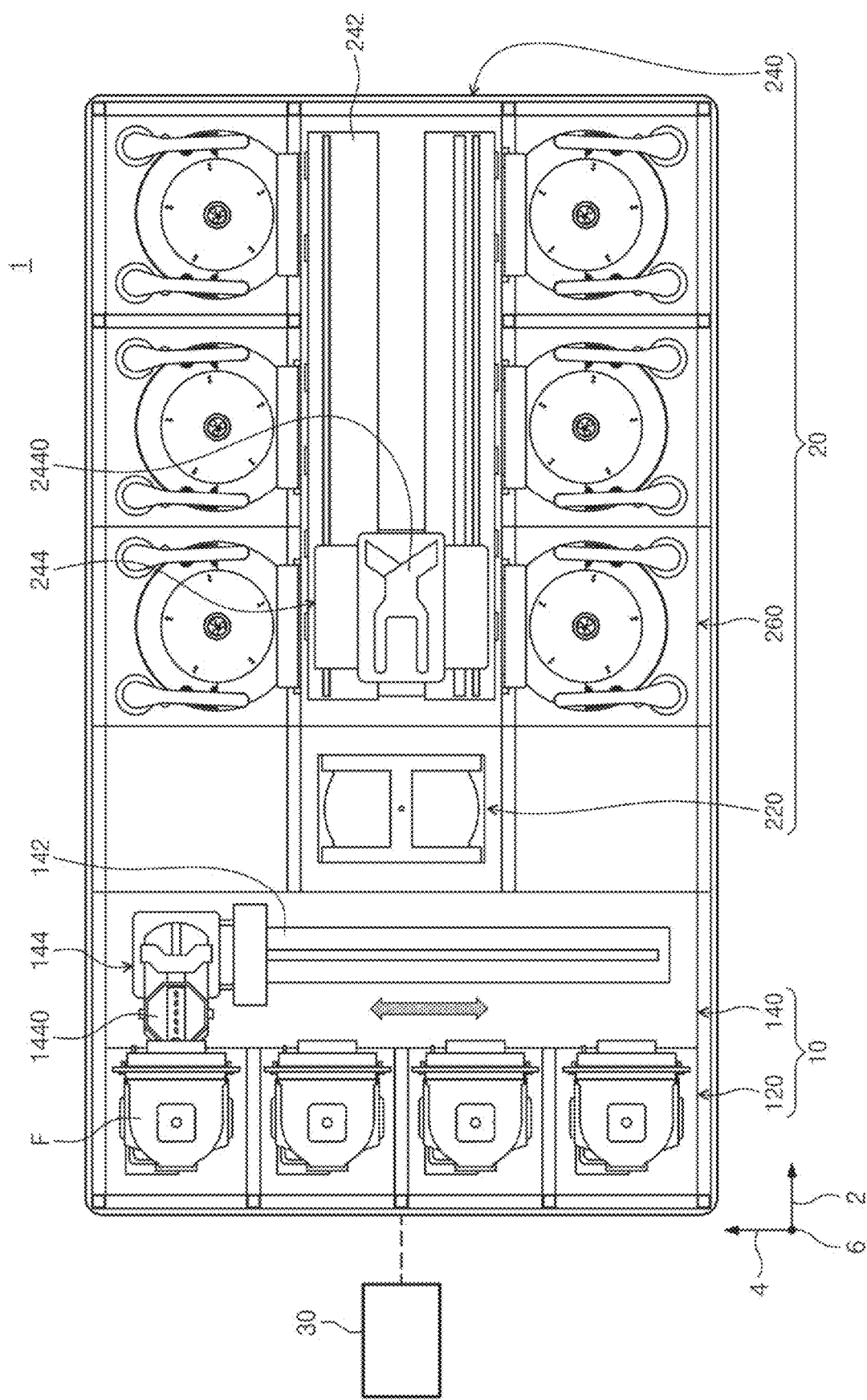
FIG. 1 is a diagram schematically illustrating an exemplary embodiment of a substrate treating apparatus of the present invention.

Hereinafter, an exemplary embodiment of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

Hereinafter, an example of the present invention will be described in detail with reference to FIGS. 1 to 19.

FIG. 1 is a top plan view schematically illustrating a substrate treating apparatus according to an exemplary embodiment of the present invention. Referring to FIG. 1, the substrate treating apparatus 1 includes an index module 10 and a treating module 20. According to the exemplary embodiment, the index module 10 and the treating module 20 are disposed in one direction. Hereinafter, the direction in which the index module 10 and the treating module 20 are arranged is defined as a first direction 2, and when viewed from above, a direction perpendicular to the first direction 2 is defined as a second direction 4, and a direction perpendicular to the plane including both the first direction 2 and the second direction 4 is defined as a third direction 6.

The index module 10 transfers a substrate W to the treating module 20 which treats a substrate W from a container F in which the substrate W is accommodated. The index module 10 accommodates the substrate W that has been completely treated in the treating module 20 into the container F. A longitudinal direction of the index module 10 is the second direction 4. The index module 10 includes a load port 110 and an index frame 140.

The container F in which the substrate W is accommodated is seated in the load port 120. The load port 120 is located at an opposite side of the treating module 20 based on the index module 140. A plurality of load ports 120 may be provided. The plurality of load ports 120 may be arranged in a line along the second direction 4. The number of load ports 120 may be increased or decreased according to process efficiency of the treating module 20 and a condition of foot print, and the like.

A plurality of slots (not illustrated) for accommodating the plurality of substrates W in a state where the substrates W are arranged horizontally with respect to the ground may be formed in the container F. As the container F, a sealing container, such as a Front Opening Unified Pod (FOUP), may be used. The container F may be placed on the load port 120 by a transfer means (not illustrated), such as an overhead transfer, an overhead conveyor, or an automatic guided vehicle, or an operator.

An index rail 142 and an index robot 144 are provided inside the index frame 140. The index rail 142 is provided along the second direction 4 in its longitudinal direction in the index frame 140. The index robot 144 may transfer the substrate W. The index robot 144 may transfer the substrate W between the index module 10 and a buffer unit 220 to be described later.

The index robot 120 includes an index hand 1440. The substrate W may be placed on the index hand 1440. The index hand 1440 may be provided to be movable in the second direction 4 on the index rail 142. Therefore, the index hand 1440 is movable forward and backward along the index rail 142. Further, the index hand 1440 may be provided to be rotatable about the third direction 6 and be movable in the third direction 6. A plurality of index hands 1440 may be provided. The plurality of index hands 1440 may be provided to be spaced apart from each other in the vertical direction. The plurality of index hands 1440 may move forwardly, backwardly, and rotationally independently of each other. The configuration of the index hand 1440 is the same as or similar to that of a transfer hand 2240, which will be described later.

The controller 30 may control the substrate treating apparatus. The controller 30 may include a process controller formed of a microprocessor (computer) that executes the control of the substrate treating apparatus, a user interface formed of a keyboard in which an operator performs a command input operation or the like in order to manage the substrate treating apparatus, a display for visualizing and displaying an operation situation of the substrate treating apparatus, and the like, and a storage unit storing a control program for executing the process executed in the substrate treating apparatus under the control of the process controller or a program, that is, a treatment recipe, for executing the process in each component according to various data and treatment conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

The controller 30 may control the substrate treating apparatus 1 so as to perform a substrate treating method described below. For example, the controller 30 may control components provided in the process chamber 260 to be described later so as to perform a substrate treating method described below.

The treating module 20 includes the buffer unit 220, a transfer frame 240, and a process chamber 260. The buffer unit 220 provides a space in which the substrate W loaded to the treating module 20 and the substrate W unloaded from the treating module 20 stay temporarily. The transfer frame 240 provides a space for transferring the substrate W between the buffer unit 220 and the process chamber 260 and between the process chambers 260. The process chamber 260 may perform a liquid treatment process of liquid-treating the substrate W by supplying a liquid onto the substrate W. For example, the liquid treating process may be a cleaning process of cleaning the substrate with a cleaning liquid. Chemical treatment, rinsing treatment, and drying treatment may all be performed on the substrate in the process chamber 260. However, unlike the above-described example, the process chamber 260 for drying the substrate may be provided separately from the process chamber 260 for performing the liquid treatment.

The buffer unit 220 may be disposed between the index frame 140 and the transfer frame 240. The buffer unit 220 may be located at one end of the transfer frame 240. A slot (not illustrated) in which the substrate W is placed is provided inside the buffer unit 220. A plurality of slots (not illustrated) is provided so as to be spaced apart from each other in the third direction 6. A front face and a rear face of the buffer unit 220 are opened. The front surface may be a surface facing the index module 10, and the rear surface may be a surface facing the transfer frame 240. The index robot 144 may approach the buffer unit 220 through the front face, and the transfer robot 244 which is to be described below may approach the buffer unit 220 through the rear face.

In the transfer frame 240, a longitudinal direction may be provided in the first direction 2. The process chambers 260 may be disposed on both sides of the transfer frame 240. The process chamber 260 may be disposed on the side of the transfer frame 240. The transfer frame 240 and the process chamber 260 may be disposed along the second direction 4.

According to one example, the process chambers 260 may be disposed on both sides of the transfer frame 240, and the process chambers 260 may be provided in an arrangement of A×B (A and B are each 1 or a natural number greater than 1) along the first direction 2 and the third direction 6 on one side of the transfer frame 240. Here, A is the number of process chambers 260 provided in a line along the first direction 2, and B is the number of process chambers 260 provided in a line along the third direction 6. For example, when four or six process chambers 260 are provided at one side of the transfer chamber 240, the process chambers 260 may be disposed in an arrangement of 2×2 or 3×2. The number of process chambers 260 may be increased or decreased. Unlike the above, the process chamber 260 may be provided only on one side of the transfer frame 240. In addition, the process chamber 260 may be provided as a single layer on one side and both sides of the transfer frame 240.

The transfer frame 240 includes a guide rail 242 and a transfer robot 244. The guide rail 242 is provided in the transfer frame 240 so that a longitudinal direction is the first direction 2. The transfer robot 244 may be provided to be linearly movable in the first direction 2 on the guide rail 242. The transfer robot 244 transfers the substrate W between the buffer unit 220 and the process chamber 260 and between the process chambers 260.

The transfer robot 244 includes a transfer hand 2440 on which the substrate W is placed. The transfer hand 2440 may be provided to be movable along the first direction 2 on the guide rail 242. Accordingly, the transfer hand 2440 is movable forwardly and backwardly along the guide rail 242. In addition, the transfer hand 2440 may be provided to be rotatable about the third direction 6 and to be movable along the third direction 6. A plurality of transfer hands 2440 may be provided. The plurality of transfer hands 2440 may be provided to be spaced apart from each other in the vertical direction. The plurality of transfer hands 2440 may move forwardly, backwardly, and rotationally independently of each other.

The process chamber 260 performs a liquid treatment process on the substrate W. For example, the process chamber 260 may be a chamber that performs a cleaning process for removing process by-products attached to the substrate W, and the like. The process chamber 260 may have a different structure according to a type of process for treating the substrate W. Alternatively, each of the process chambers 260 may have the same structure.

Figure 2:
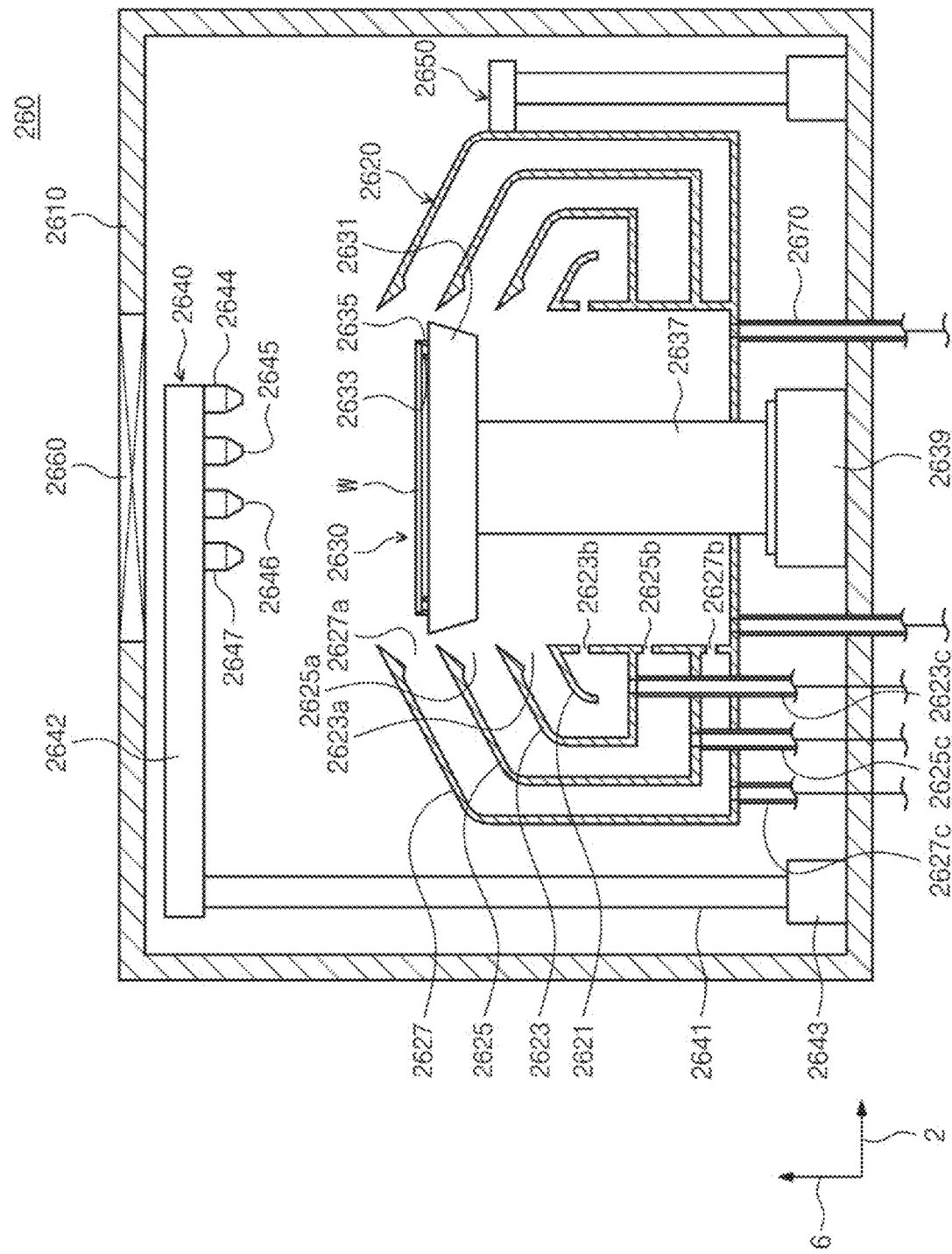
FIG. 2 is a diagram schematically illustrating an exemplary embodiment of a process chamber of FIG. 1.

FIG. 2 is a diagram schematically illustrating the exemplary embodiment of the process chamber of FIG. 1. Referring to FIG. 2, the process chamber 260 includes a housing 2610, a treatment container 2620, a support unit 2630, a liquid supply unit 2640, and a lifting unit 2650.

The housing 2610 has an inner space. The housing 2610 is provided in the shape of a generally rectangular parallelepiped. An opening (not illustrated) is formed at one side of the housing 2610. The opening (not illustrated) functions as an entrance through which the substrate W is loaded into the internal space or the substrate W is unloaded from the inner space. The treatment container 2620, the support unit 2630, and the liquid supply unit 2640 are disposed within the housing 2610.

The treatment container 2620 has a treatment space having an open top. The treatment container 2820 may be a bowl having a treatment space. The treatment container 2620 may be provided to surround the treatment space. The treatment space of the treatment container 2620 may be a space in which the support unit 2630 to be described later supports and rotates the substrate W. The treatment space may be a space in which the substrate W is treated by supplying a liquid onto the substrate W by the liquid supply unit 2640 to be described later.

According to the example, the treatment container 2620 may have a guide wall 2621 and a plurality of collection containers 2623, 2625, and 2627. The collection containers 2623, 2625, and 2627 separates and recovers different liquids from among the liquids used for treating the substrate W, respectively. Each of the collection containers 2623, 2625, and 2627 may have a collection space for recovering the treatment liquid used for treating the substrate W.

The guide wall 2621 and each of the collection containers 2623, 2625, and 2627 may be provided in an annular ring shape surrounding the support unit 2630. When the liquid treatment process is in progress, the treatment liquid scattered by the rotation of the substrate W may be introduced into the collection space through inlets 2623a, 2625a, and 2627a of the respective collection containers 2623, 2625, and 2627 to be described later. Different types of liquid may be introduced into of the collection containers 2623, 2625, and 2627, respectively.

The treating container 2620 has a guide wall 2621, a first collection container 2623, a second collection container 2625, and a third collection container 2627. The guide wall 2621 is provided in an annular ring shape surrounding the support unit 2630. The first collection container 2623 is provided in an annular ring shape surrounding the guide wall 2621. The second collection container 2625 is provided in an annular ring shape surrounding the first collection container 2623. The third collection container 2627 is provided in an annular ring shape surrounding the second collection container 2625. A space between the first collection container 2623 and the guide wall 2621 functions as a first inlet 2623a through which the liquid is introduced. A space between the first collection container 2623 and the second collection container 2625 functions as a second inlet 2625a through which the liquid is introduced. A space between the second collection container 2625 and the third collection container 2627 functions as a third inlet 2627a through which the liquid is introduced. The second inlet 2625a may be located above the first inlet 2623a, and the third inlet 2627a may be located above the second inlet 2625a.

A space between the lower end of the guide wall 2621 and the first collection container 2623 functions as a first outlet 2623b through which fume and airflow generated from the liquid are discharged. A space between the lower end of the first collection container 2623 and the second collection container bin 2625 functions as a second outlet 2625b through which fumes and airflow generated from the liquid are discharged. A space between the lower end of the second collection container 2625 and the third collection container 2627 functions as a third outlet 2627b through which fumes and airflow generated from the liquid are discharged. The fume and airflow discharged from the first outlet 2623b, the second outlet 2625b, and the third outlet 2627b are exhausted to the outside through an exhaust unit 2670 which is to be described later.

Collection lines 2623c, 2625c, and 2627c extending vertically downwards from the bottom surfaces of the collection containers 2623, 2625, and 2627 are connected to the collection containers 2623, 2625, and 2627, respectively. The collection lines 2623c. 2625c, and 2627c discharge the treatment liquids introduced through the collection containers 2623, 2625, and 2627, respectively. The discharged treatment liquid may be reused through an external treatment liquid regeneration system (not illustrated).

The support unit 2630 supports and rotates the substrate W in the treatment space. The support unit 2630 may include a spin chuck 2631, a support pin 2633, a chuck pin 2635, a rotation shaft 2637, and a driver 2639.

The spin chuck 2631 has an upper surface that is provided in a generally circular shape when viewed from above. The upper surface of the spin chuck 2631 may be provided to have a larger diameter than the substrate W.

A plurality of support pins 2633 is provided. The support pin 2633 is disposed on the upper surface of the spin chuck 2631. The support pins 2633 are disposed to be spaced apart from each other at a predetermined interval on the edge portion of the upper surface of the spin chuck 2631, and protrude upward from the upper surface of the spin chuck 2631. The support pins 2633 are arranged to have an annular ring shape as a whole by combination with each other. The support pin 2633 supports an edge of the rear surface of the substrate W so that the substrate W is spaced apart from the upper surface of the spin chuck 2631 at a predetermined distance.

A plurality of chuck pins 2635 is provided. The chuck pin 2635 is disposed farther from the center of the spin chuck 2631 than the support pin 2633. The chuck pin 2635 is provided to protrude from the upper surface of the spin chuck 2631. The chuck pin 2635 supports the lateral portion of the substrate W so as not to be laterally separated from the original position when the substrate W is rotated. The chuck pin 2635 is provided to be linearly movable between a standby position and a support position along a radial direction of the spin chuck 2631. The standby position is a position farther from the center of the spin chuck 2631 compared to the support position. When the substrate W is loaded into or unloaded from the support unit 2630, the chuck pin 2635 is positioned at the standby position, and when the process is performed on the substrate W, the chuck pin 2635 is positioned at the support position. At the support position, the chuck pin 2635 is in contact with the lateral portion of the substrate W.

The rotation shaft 2637 is coupled with the spin chuck 2631. The rotation shaft 2637 may be coupled to a lower surface of the spin chuck 2631. The rotation shaft 2637 may be provided such that the longitudinal direction faces the vertical direction. The rotation shaft 2637 is provided to be rotatable by receiving power from the driver 2639. The rotation shaft 2637 rotates by the driver 2639 to rotate the spin chuck 2631. The driver 2639 may vary the rotation speed of the rotation shaft 2637. The driver 2639 may be a motor that provides driving force. However, the present invention is not limited thereto, and the driver may be variously modified to a publicly known device providing driving force.

The liquid supply unit 2640 supplies the liquid to the substrate W. The liquid supply unit 2640 supplies a liquid to the substrate W supported by the support unit 2630. The liquid supplied by the liquid supply unit 2640 may be provided in a plurality of types and the plurality of types of liquid may be sequentially supplied onto the substrate W. The liquid according to the exemplary embodiment of the present invention may be any one of a treatment liquid C1, a first stripping liquid C2, a second stripping liquid C3, and a rinse liquid C4. The liquid supply unit 2640 includes a support rod 2641, an arm 2642, a driver 2643, a treatment liquid supply nozzle 2644, a first stripping liquid supply nozzle 2645, and a second stripping liquid supply nozzle 2646, and a rinse liquid supply nozzle 2647.

The support rod 2641 is located in the inner space of the housing 2610. The support rod 2641 is positioned on one side of the treatment container 2620 in the inner space. The support rod 2641 may have a rod shape in which a longitudinal direction faces the third direction 6. The support rod 2641 is provided to be rotatable by the driver 2643 to be described later.

Arm 2642 is coupled to an upper end of the support rod 2641. The arm 2642 extends vertically from the longitudinal direction of the support rod 2641. The treatment liquid supply nozzle 2644, the first stripping liquid supply nozzle 2645, the second stripping liquid supply nozzle 2646, and the rinse liquid supply nozzle 2647, which will be described later, may be fixedly coupled to an end of the arm 2642. The arm 2642 may be provided to be movable forwardly and backwardly in the longitudinal direction thereof. The arm 2642 may swing and move as the driver 2643, which will be described later, rotates the support rod 2641. Due to the rotation of the arm 2642, the treatment liquid supply nozzle 2644, the first stripping liquid supply nozzle 2645, the second stripping liquid supply nozzle 2646, and the rinse liquid supply nozzle 2647 also swing and move to move between the process position and the standby position.

The process position is a position at which any one of the treatment liquid supply nozzle 2644, the first stripping liquid supply nozzle 2645, the second stripping liquid supply nozzle 2646, and the rinse liquid supply nozzle 2647 faces the substrate W supported by the support unit 2630. The standby position is a position at which all of the treatment liquid supply nozzle 2644, the first stripping liquid supply nozzle 2645, the second stripping liquid supply nozzle 2646, and the rinse liquid supply nozzle 2647 deviate from the process position.

The driver 2643 is coupled with the support rod 2641. The driver 2643 may be disposed on the bottom surface of the housing 2610. The driver 2643 provides driving force for rotating the support rod 2641. The actuator 2643 may be provided as a known motor that provides driving force.

The treatment liquid supply nozzle 2644 supplies the treatment liquid C1 to the substrate W. According to the example, the treatment liquid supply nozzle 2644 may supply the treatment liquid C1 onto the substrate W supported by the support unit 2630. The treatment liquid C1 may include a polymer and a solvent. According to the example, the polymer may include a resin. The resin may be an acrylic resin, a phenolic resin, or another kind of resin. The solvent may be a solution that dissolves the polymer and has a volatile component. When the solvent is volatilized in the treatment liquid C1 supplied on the substrate W, the treatment liquid C1 may be solidified on the substrate W.

The first stripping liquid supply nozzle 2645 may supply the first stripping liquid C2 to the substrate W. According to the example, the first stripping liquid supply nozzle 2645 may supply the first stripping liquid C2 onto the substrate W supported by the support unit 2630. The first stripping liquid C2 may be deionized water (DIW). The first stripping liquid C2 may strip a liquid film S formed by the solidification of the treatment liquid C1 on the substrate W.

The second stripping liquid supply nozzle 2646 may supply the second stripping liquid C2 to the substrate W. According to the example, the second stripping liquid supply nozzle 2646 may supply the second stripping liquid C3 onto the substrate W supported by the support unit 2630. The second stripping liquid C3 may be a hydrogen peroxide ($H_2O_2$). Optionally, the second stripping liquid C3 may be a mixture of a hydrogen peroxide solution ($H_2O_2$) and deionized water (DIW). The second stripping liquid C3 may strip the liquid film S formed by the solidification of the treatment liquid C2 on the substrate W.

The rinse liquid supply nozzle 2647 may supply the rinse liquid C4 to the substrate W. According to the example, the rinse liquid supply nozzle 2647 may supply the rinse liquid C4 onto the substrate W supported by the support unit 2630. The rinse liquid C4 may be an organic solvent. According to the example, the rinse liquid C4 may include alcohol, such as isopropyl alcohol (IPA).

The above-described liquid supply unit 2640 according to the exemplary embodiment of the present invention has been described based on the case where all of the treatment liquid supply nozzle 2644, the first stripping liquid supply nozzle 2645, the second stripping liquid supply nozzle 2646, and the rinse liquid supply nozzle 2647 are coupled to the arm 2642 as an example, but the present invention is not limited thereto. For example, each of the treatment liquid supply nozzle 2644, the first stripping liquid supply nozzle 2645, the second stripping liquid supply nozzle 2646, and the rinse liquid supply nozzle 2647 are coupled to the arm 2642 may independently have an arm, a support rod, and a driver, and may independently swing and move forwardly and backwardly.

The lifting unit 2650 is disposed within the housing 2610. The lifting unit 2650 adjusts the relative height between the treatment container 2620 and the support unit 2630. The lifting unit 2650 linearly moves the treatment container 2620 in the third direction 6. Accordingly, since the height of the collection containers 2623, 2625, and 2627 for recovering the liquid is changed according to the type of the liquid supplied to the substrate W, the liquids may be separated and collected. Unlike the above description, the treatment container 2630 may be fixedly installed, and the lifting unit 2650 may move the supporting unit 2630 in the vertical direction.

The airflow supply unit 2660 supplies an airflow to the inner space of the housing 2610. The airflow supply unit 2660 may supply a descending airflow to the inner space. The airflow supply unit 2660 may be installed in the housing 2610. The airflow supply unit 2660 may be installed above the treatment container 2620 and the support unit 2630. The gas supplied to the inner space of the housing 2610 through the airflow supply unit 2660 forms a descending airflow in the inner space. A gas by-product generated by the treatment process in the treatment space is discharged to the outside of the housing 2610 through the exhaust unit 2670 to be described later by the descending airflow. The airflow supply unit 2660 may be provided as a fan filter unit.

The exhaust unit 2670 exhausts fumes and gas generated in the treatment space. The exhaust unit 2670 exhausts fumes and gas generated when the substrate W is treated with the liquid. The exhaust unit 2650 may be coupled to the bottom surface of the treatment container 2620. In the exemplary embodiment, the exhaust unit 2670 may be provided in a space between the rotation shaft 2637 and an inner wall of the treatment container 2620. The exhaust unit 2670 includes a decompression unit (not illustrated). Fume and gas generated when the substrate W is liquid-treated are exhausted from the treatment space to the outside of the treatment space by the decompression unit (not illustrated).

Hereinafter, the substrate treating method according to the exemplary embodiment of the present invention will be described in detail. The substrate treating method described below may be performed by the process chamber 260. Also, the controller 30 may control the components of the process chamber 260 so that the process chamber 260 may perform the substrate treating method described below. For example, the controller 30 may generate a control signal for controlling at least one of the support unit 2630 and the liquid supply unit 2640 so that the substrate treating method described below may be performed in the process chamber 260.

Figure 3:
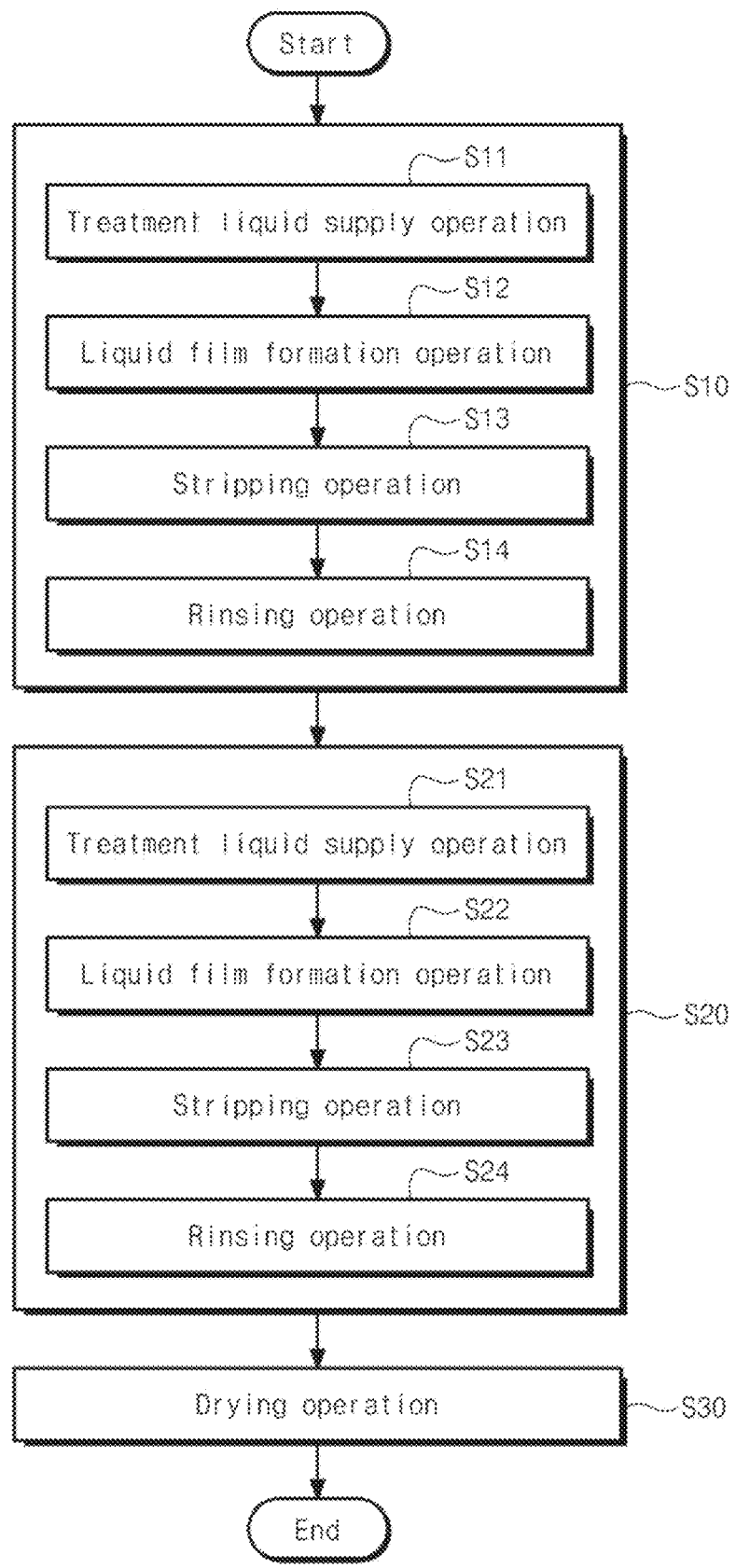
FIG. 3 is a flowchart of a substrate treating method according to an exemplary embodiment of the present invention.
Figure 4:
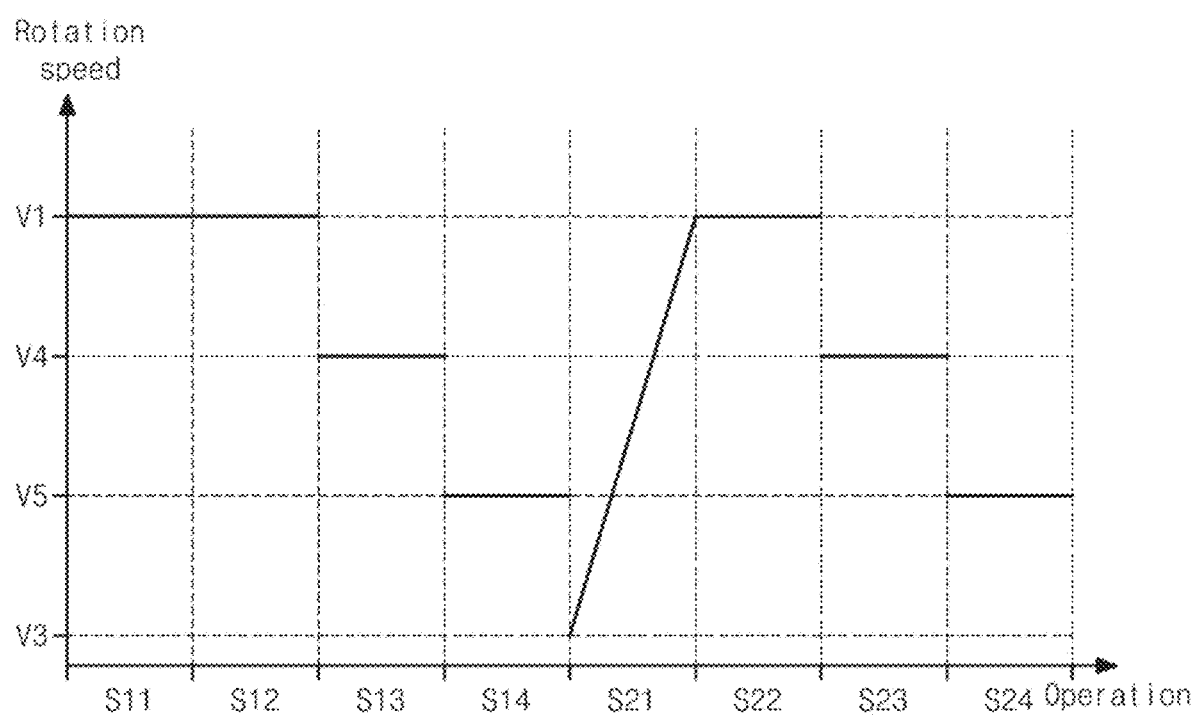
FIG. 4 is a graph schematically illustrating a rotation speed of a substrate in the substrate treating method of FIG. 3.

FIG. 3 is a flowchart of the substrate treating method according to the exemplary embodiment of the present invention. FIG. 4 is a graph schematically illustrating a rotation speed of a substrate in the substrate treating method of FIG. 3. Referring to FIGS. 3 and 4, the substrate treating method according to the exemplary embodiment of the present invention may be a cleaning process of supplying a liquid to the substrate W to remove particles P attached to the substrate W.

The substrate treating method according to the exemplary embodiment of the present invention may include a prior removal operation S10, a post removal operation S20, and a drying operation S30. The prior removal operation S10 may preemptively remove the particles P attached to the substrate W. In the prior removal operation S10, a liquid may be supplied to the substrate W to capture and remove particles P existing on the substrate W. The prior removal operation S10 may be the first process. For example, the prior removal operation S10 may be the first cleaning process.

In the post removal operation S20, the residual particles P which has not be removed in the prior removal operation S10 may be captured and removed. In the post removal operation S20, the liquid may be supplied to the substrate W to capture and remove the particles P remaining on the substrate W secondarily. The post removal operation S20 may be the second process performed after the prior removal operation S10 is performed. For example, the post removal operation S20 may be the second cleaning process.

In the drying operation S30, the liquid remaining on the substrate W may be dried by rotating the substrate W at a high speed after the postal removal operation S20 is performed. The drying operation S30 may be performed in the process chamber 260. Optionally, the drying operation S30 may also be performed in a chamber provided separately from the process chamber 260.

The prior removal operation S10 may include a treatment liquid supply operation S11, a liquid film formation operation S12, a stripping operation S13, and a rinsing operation S14. The treatment liquid supply operation S11, the liquid film formation operation S12, the stripping operation S13, and the rinsing operation S14 of the prior removal operation may be sequentially performed. The post removal operation S20 may include a treatment liquid supply operation S21, a liquid film formation operation S22, a stripping operation S23, and a rinsing operation S24. The treatment liquid supply operation S21, the liquid film formation operation S22, the stripping operation S23, and the rinsing operation S24 of the post removal operation S20 may be sequentially performed.

In the prior removal operation S10 and the post removal operation S20, the substrate W is rotated through the rotation of the support unit 2630. In the treatment liquid supply operation S11 of the prior removal operation S10, the substrate W may rotate at a first speed. According to the example, the first speed may be 1500 rpm. In the liquid film formation operation S12 of the prior removal operation S10, the substrate W may rotate at the first speed. According to the example, the first speed may be 1500 rpm. In the stripping operation S13 of the prior removal operation S10, the substrate W may rotate at a fourth speed. According to the example, the fourth speed may be 1000 rpm. In the rinsing operation S14 of the prior removal operation S10, the substrate W may rotate at a fifth speed. For example, the fifth speed may be 500 rpm.

In the treatment liquid supply operation S21 of the post removal operation S20, the substrate W may rotate at a second average speed. According to the example, the substrate W may rotate at a third speed at the time of supplying the treatment liquid C1 to the substrate W in the treatment liquid supply operation S21 of the post removal operation S20. Further, the substrate W may rotate at the first speed at an end point at which the supply of the treatment liquid C1 to the substrate W in the treatment liquid supply operation S21 of the post removal operation S20 is stopped. For example, the third speed may be 100 rpm, and the first speed may be 1500 rpm.

According to the example, in the treatment liquid supply operation S21 of the post removal operation S20, while treatment liquid C1 is supplied to the substrate W, the substrate W rotates at the first speed from the third speed at a constant acceleration rate and the rotation speed may be changed. However, the present invention is not limited thereto, and in the treatment liquid supply operation S21 of the post removal operation S20, the substrate W may rotate at a constant speed of the third speed while the treatment liquid C1 is supplied to the substrate W, and the substrate W may rotate at a constant speed of the first speed after the treatment liquid C1 is completely supplied.

In the liquid film formation operation S22 of the post removal operation S20, the substrate W may rotate at the first speed. The first speed may be 1500 rpm. In the stripping operation S23 of the post removal operation S20, the substrate W may rotate at the fourth speed. According to the example, the fourth speed may be 1000 rpm. In the rinsing operation S24 of the post removal operation S20, the substrate W may rotate at the fifth speed. For example, the fifth speed may be 500 rpm.

Figure 5:
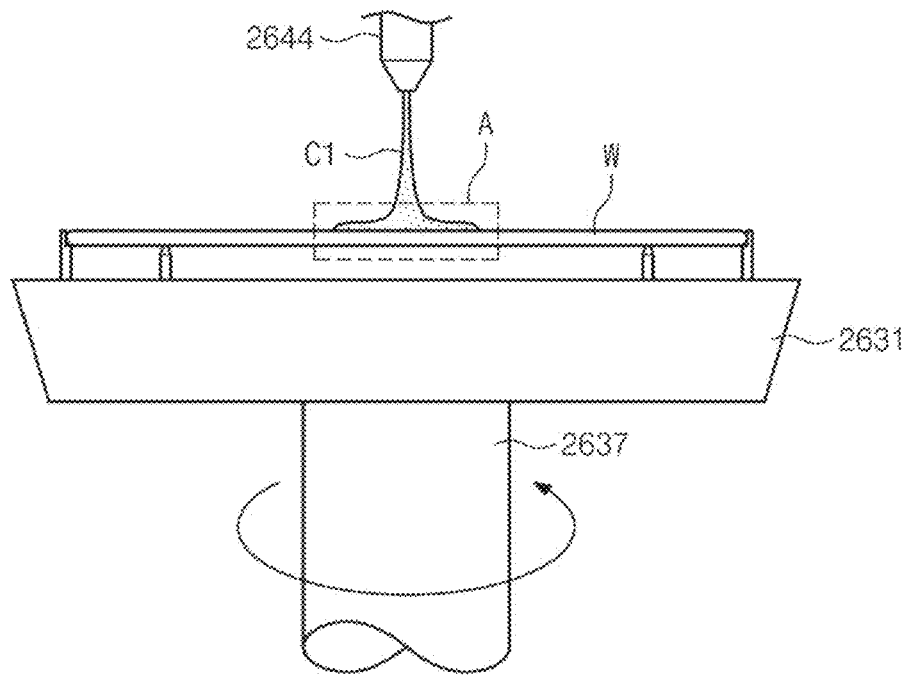
FIG. 5 is a diagram schematically illustrating a state in which a treatment liquid is supplied to a substrate in a prior removal operation of FIG. 3.
Figure 6:
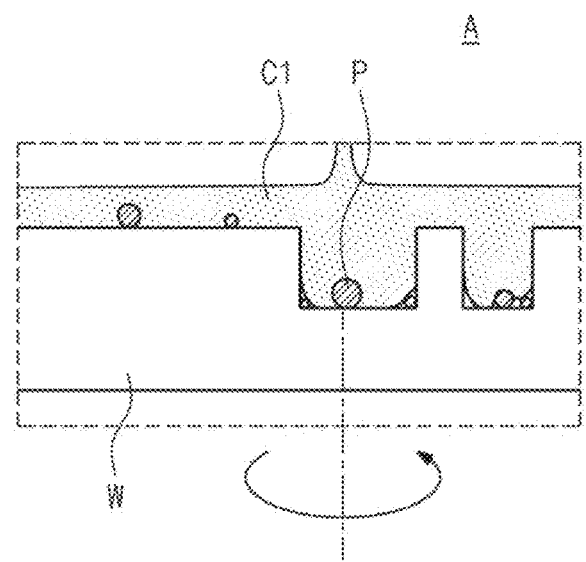
FIG. 6 is a diagram schematically illustrating an enlarged state of part A of FIG. 5.

FIG. 5 is a diagram schematically illustrating a state in which the treatment liquid is supplied to the substrate in the prior removal operation of FIG. 3. FIG. 6 is a diagram schematically illustrating an enlarged state of part A of FIG. 5.

Referring to FIG. 5, in the treatment liquid supply operation S11 of the prior removal operation S10, the treatment liquid C1 may be supplied to the substrate W supported by the support unit 2830. Also, in the treatment liquid supply operation S11, the treatment liquid C1 may be supplied to the substrate W rotated by the support unit 2830. As described above, in the treatment liquid supply operation S11, the substrate W may rotate at a speed of 1500 rpm. The treatment liquid C1 may include a polymer and a solvent.

In the treatment liquid supply operation S11, the treatment liquid supply nozzle 2644 may supply the treatment liquid C1 from an upper portion of the substrate W to the center of the substrate W. For example, the center of the treatment liquid supply nozzle 2644 may coincide with the center of the substrate W when viewed from the top. As the substrate W is rotated, the treatment liquid C1 applied to the central region of the substrate W may flow toward the edge region of the substrate W.

Referring to FIG. 6, the treatment liquid C1 is applied to the substrate W on which a pattern is formed. The treatment liquid C1 may flow between the plurality of patterns on the substrate W. Accordingly, the treatment liquid C1 may cover the particles P positioned on the upper surface of the pattern formed on the substrate W.

Figure 7:
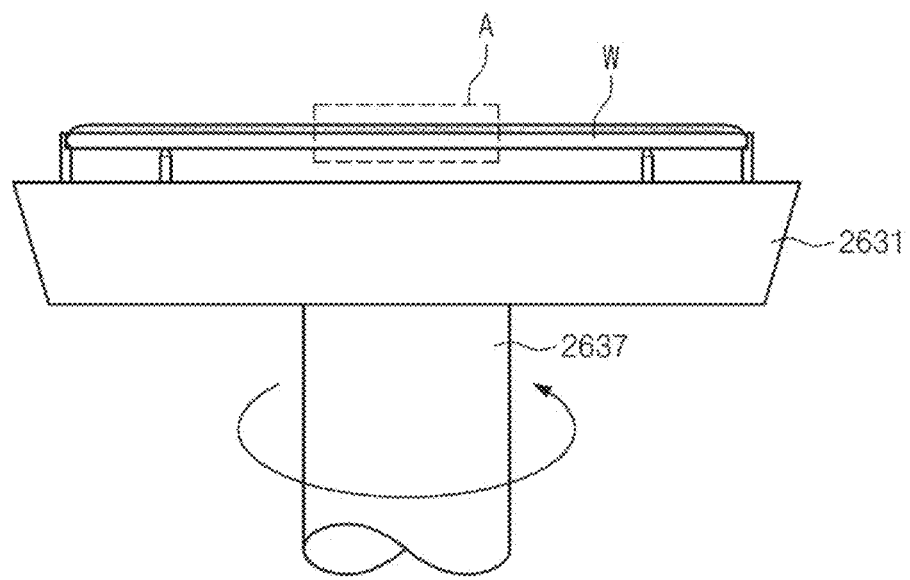
FIG. 7 is a diagram schematically illustrating a state in which a substrate is rotated to form a liquid film in the prior removal operation of FIG. 3.
Figure 8:
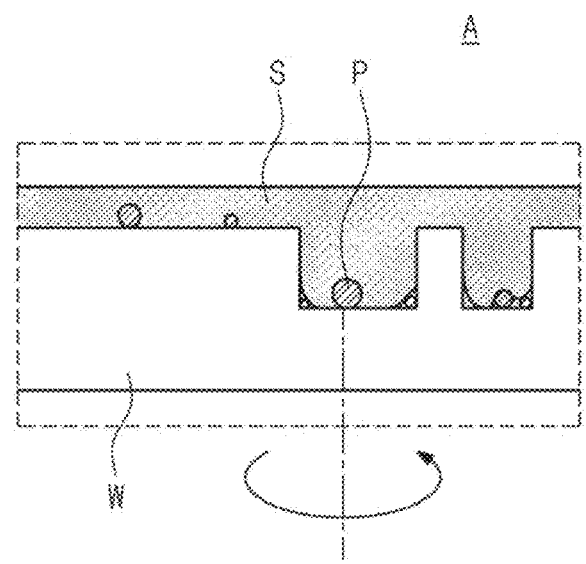
FIG. 8 is a diagram schematically illustrating an enlarged state of part A of FIG. 7.

FIG. 7 is a diagram schematically illustrating a state in which the substrate is rotated to form a liquid film in the prior removal operation of FIG. 3. FIG. 8 is a diagram schematically illustrating an enlarged state of part A of FIG. 7.

Referring to FIG. 7, the liquid film formation operation S12 in the prior removal operation S10 rotates the support unit 2830. As the support unit 2830 rotates, the substrate W supported by the support unit 2830 also rotates. In the liquid film formation operation S12, the substrate W may rotate at a speed of 1500 rpm. In the liquid film formation operation S12, the liquid supply unit 2640 may be located in the standby position. In the liquid film formation operation S12, the solvent among the polymer and the solvent included in the treatment liquid C1 supplied on the substrate W may be volatilized by rotating the substrate W.

Referring to FIG. 8, the liquid film S of the solidified treatment liquid C1 is formed on the substrate W by rotating the substrate W to volatilize the solvent. As the solvent volatilizes in the treatment liquid C1, volume shrinkage occurs, and the treatment liquid C1 is solidified. As the volume of the treatment liquid C1 shrinks, particles in the pattern formed on the substrate W and particles P deposited on the upper surface of the pattern may be captured in the liquid film S of the treatment liquid C1.

Figure 9:
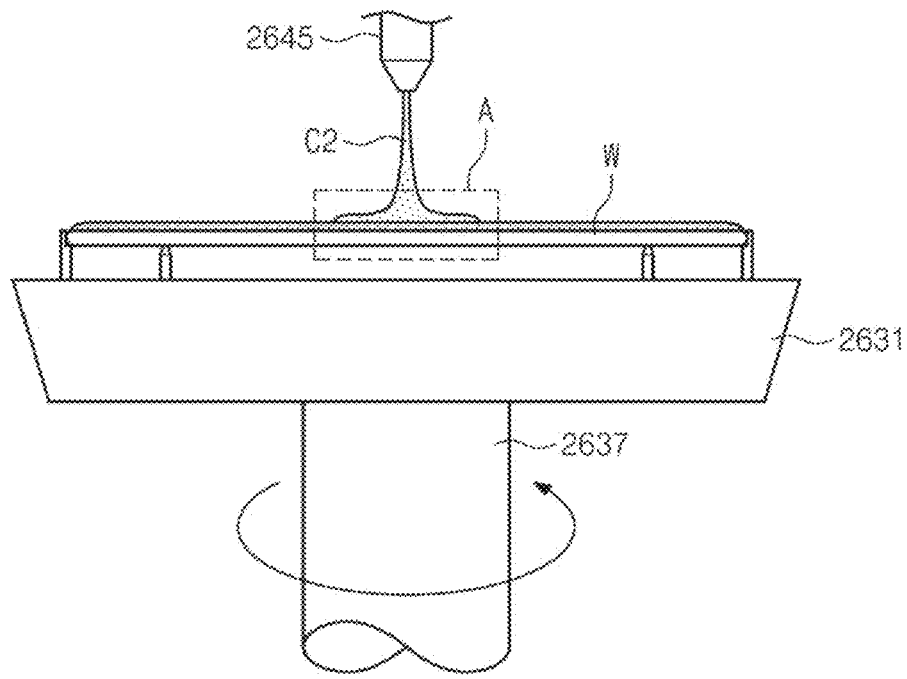
FIG. 9 is a diagram schematically illustrating a state in which a first stripping liquid is supplied to the substrate in the prior removal operation of FIG. 3.
Figure 10:
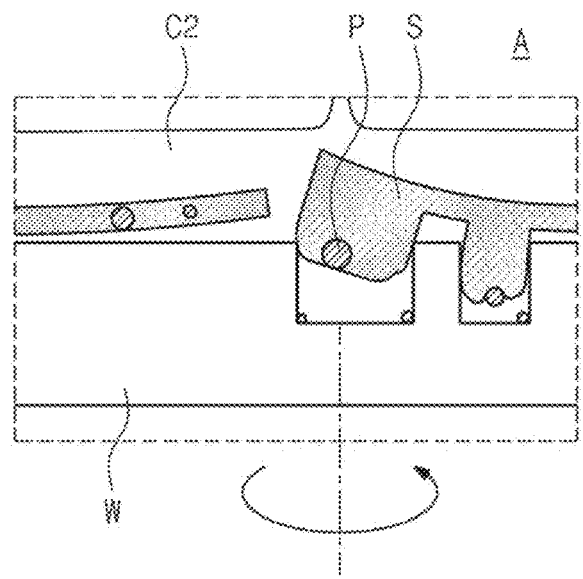
FIG. 10 is a diagram schematically illustrating an enlarged state of part A of FIG. 9.

FIG. 9 is a diagram schematically illustrating a state in which the first stripping liquid is supplied to the substrate in the prior removal operation of FIG. 3. FIG. 10 is a diagram schematically illustrating an enlarged state of part A of FIG. 9.

Referring to FIG. 9, in the stripping operation S13 in the prior removal operation S10, the first stripping liquid C2 may be supplied to the substrate W supported by the support unit 2830. In addition, in the stripping operation S13, the first stripping liquid C2 may be supplied to the substrate W rotated by the support unit 2830. In the stripping operation S13, the first stripping liquid supply nozzle 2645 discharges the first stripping liquid C2 to the substrate W. As described above, in the stripping operation S13, the substrate W may rotate at a speed of 1000 rpm. According to the example, the first stripping liquid C2 may be provided with deionized water (DIW).

In the stripping operation S13, the first stripping liquid supply nozzle 2645 may supply the first stripping liquid C2 from the top of the substrate W to the center of the substrate W. For example, the center of the first stripping liquid supply nozzle 2645 may coincide with the center of the substrate W when viewed from the top. As the substrate W is rotated, the first stripping liquid C2 discharged to the central region of the substrate W may flow toward the edge region of the substrate W.

Referring to FIG. 10, the first stripping liquid C2 may flow on the substrate W on which the pattern is formed. The liquid film S may be stripped off from the substrate W on which the pattern is formed by the first stripping liquid C2. The first stripping liquid C2 may permeate into the liquid film S of the solidified treatment liquid C1. When the first stripping liquid C2 penetrates the interface between the liquid film S of the treatment liquid C1 and the substrate W, the liquid film S of the treatment liquid C1 may be stripped from the substrate W. Accordingly, the particles P attached to the pattern formation surface of the substrate W may be stripped off from the substrate W together with the liquid film S.

Figure 11:
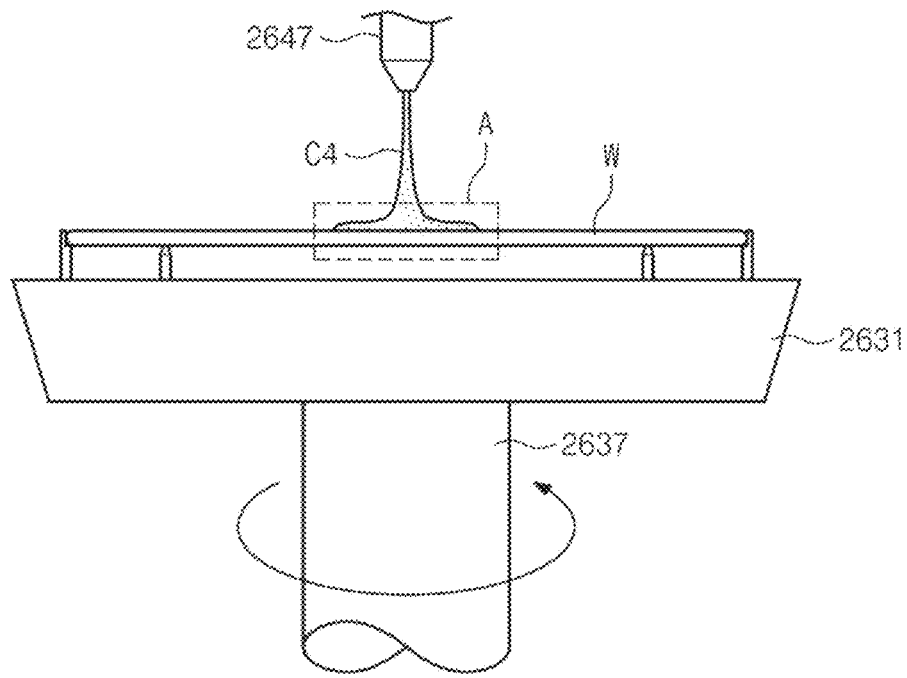
FIG. 11 is a diagram schematically illustrating a state in which a rinse liquid is supplied to a substrate in the prior removal operation of FIG. 3.
Figure 12:
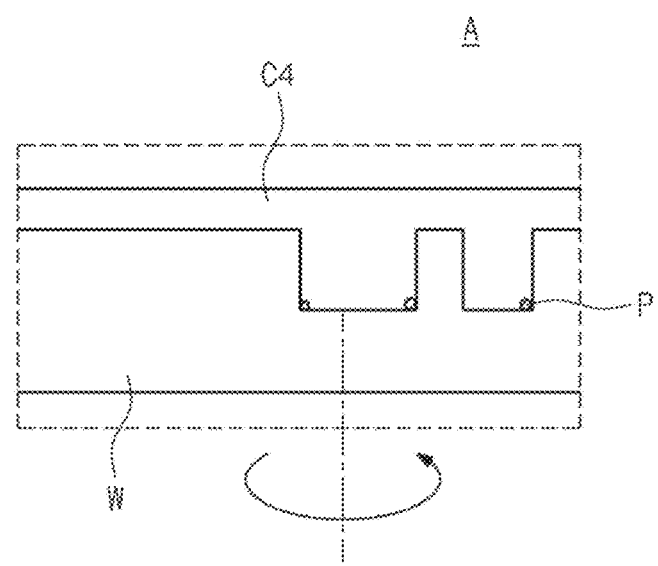
FIG. 12 is a view schematically illustrating an enlarged state of part B of FIG. 11.

FIG. 11 is a diagram schematically illustrating a state in which the rinse liquid is supplied to the substrate in the prior removal operation of FIG. 3, and FIG. 12 is a view schematically illustrating an enlarged state of part B of FIG. 11.

Referring to FIG. 11, in the rinsing operation S14 in the prior removal operation S10, a rinse liquid C4 may be supplied to the substrate W supported by the support unit 2830. Also, in the rinsing operation S14, the rinse liquid C4 may be supplied to the substrate W rotated by the support unit 2830. As described above, in the rinsing operation S14, the substrate W may rotate at a speed of 500 rpm. In the rinse liquid supply operation S14, the substrate W is rotated for a preset time for maintaining the wet state in which the rinse liquid C4 remains on the surface of the substrate W. Accordingly, the treatment liquid C1 supplied in the treatment liquid supply operation S21 of the post removal operation S20 to be described later may be mixed with the rinse liquid C4. The rinse liquid C4 may be an organic solvent. According to one example, the rinse liquid C4 may be isopropyl alcohol.

In the rinsing operation S14, the rinse liquid supply nozzle 2647 may supply the rinse liquid C4 from the upper portion of the substrate W to the center of the substrate W. For example, the center of the rinse liquid supply nozzle 2647 may coincide with the center of the substrate W when viewed from the top. As the substrate W is rotated, the rinse liquid C4 discharged to the central region of the substrate W may flow toward the edge region of the substrate W.

Referring to FIG. 12, the rinse liquid C4 may flow to the substrate W on which the pattern is formed. The rinse liquid C4 discharged onto the substrate W may remove the residue of the liquid film S that is not completely removed from the substrate W. The liquid film S removed by the rinse liquid C4 may be washed out of the substrate W by the rotation of the substrate W. In addition, the rinse liquid C4 may replace the first stripping liquid C1 present on the substrate W.

However, as illustrated in FIG. 12, the fine particles P may not be removed from the substrate W on which the prior removal operation S10 has been completed. Also, the particles P deposited on the edge region of the space formed between the patterns on the substrate W may not be completely removed. This phenomenon occurs because the treatment liquid C1 supplied in the prior removal operation S10 does not penetrate to the edge region of the space formed between the plurality of patterns on the substrate W. Also, since the volume of the treatment liquid C1 is contracted during the solidification process, particles existing in the edge region of the space between the patterns are not captured by the solidified liquid film S. This problem is further exacerbated when fine particles are deposited in the edge region of the space formed between the patterns. Accordingly, in the post removal operation S20 according to the exemplary embodiment of the present invention, the particles P that are not removed from the substrate W may be removed secondarily (or subsequently) again. Hereinafter, the post removal operation S20 according to the exemplary embodiment of the present invention will be described in detail.

Figure 13:
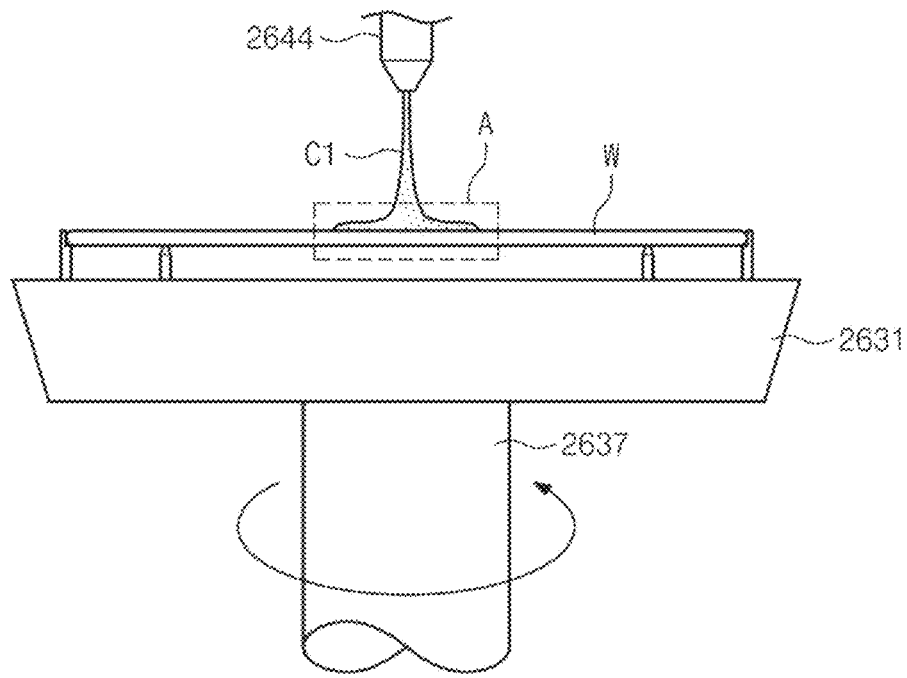
FIG. 13 is a diagram schematically illustrating a state in which a treatment liquid is supplied to the substrate in a post removal operation of FIG. 3.
Figure 14:
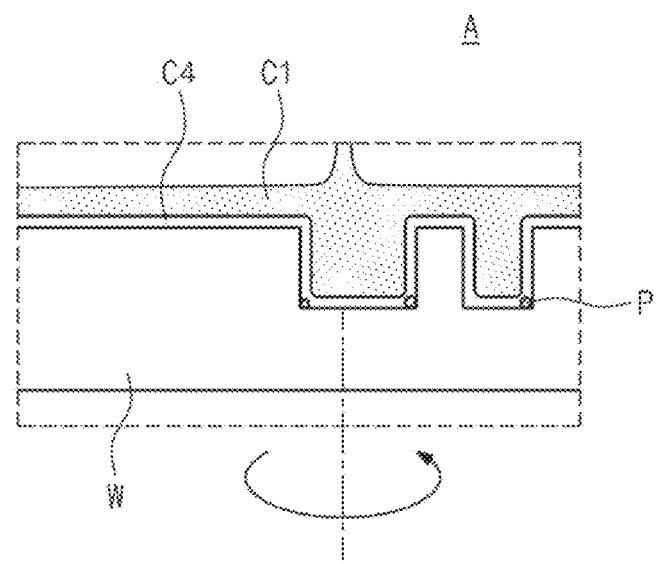
FIG. 14 is a diagram schematically illustrating an enlarged state of part A of FIG. 13.

FIG. 13 is a diagram schematically illustrating a state in which the treatment liquid is supplied to the substrate in the post removal operation of FIG. 3, and FIG. 14 is a diagram schematically illustrating an enlarged state of part A of FIG. 13.

Referring to FIG. 13, in the treatment liquid supply operation S21 of the post removal operation S20 according to an exemplary embodiment of the present invention, the treatment liquid C1 may be supplied to the substrate W supported by the support unit 2830. In the treatment liquid supply operation S21, the treatment liquid C1 may be supplied to the substrate W rotated by the support unit 2830. The treatment liquid C1 may include a polymer and a solvent. In the treatment liquid supply operation S11, the treatment liquid supply nozzle 2644 may supply the treatment liquid C1 from the upper portion of the substrate W to the center of the substrate W. For example, the center of the treatment liquid supply nozzle 2644 may coincide with the center of the substrate W when viewed from the top. As the substrate W is rotated, the treatment liquid C1 applied to the central region of the substrate W may flow toward the edge region of the substrate W.

According to the example, in the treatment liquid supply operation S21, the treatment liquid C1 may be supplied to the substrate W to which the rinse liquid C4 has been supplied. As described with reference to FIG. 4, in the treatment liquid supply operation S21, the substrate W may rotate at a second average speed. The second average speed may be lower than 1500 rpm and may be equal to or higher than 100 rpm. The rotation speed of the substrate W in the treatment liquid supply operation S21 of the post removal operation S20 is relatively lower than the rotation speed of the substrate W in the treatment liquid supply operation S11 of the prior removal operation S10.

The rinse liquid C4 according to the exemplary embodiment of the present invention is provided with isopropyl alcohol. Isopropyl alcohol has a low surface tension and strong volatility. When the high rotation speed of the substrate W is formed, all of the rinse liquid C4 discharged to the substrate W is volatilized to dry the substrate W.

Accordingly, according to the exemplary embodiment of the present invention, by providing the rotation speed of the substrate W as the second average speed in the treatment liquid supply operation S21 of the post removal operation S20, it is possible to minimize volatilization of the rinse liquid C4 supplied in the prior removal operation S10 on the substrate W while the treatment liquid C4 is supplied in the post removal operation S20. By minimizing volatilization of the rinse liquid C4 supplied in the prior removal operation S10 from the substrate W, a condition in which the substrate W is wetted with the rinse liquid C4 may be formed.

Referring to FIG. 14, the treatment liquid C1 is applied to the substrate W on which the pattern is formed. According to the example, the treatment liquid C1 supplied in the treatment liquid supply operation S21 of the post removal operation S20 may be mixed with the rinse liquid C4 wetted on the surface of the substrate W. The treatment liquid C1 is supplied to the substrate W under the condition that the rinse liquid C4 remains on the surface of the substrate W, so that the treatment liquid C1 and the rinse liquid C4 may be mixed. According to the example, the surface tension of the rinse liquid C4 is relatively lower than the surface tension of the treatment liquid C1. The rinse liquid C4 having the low surface tension has already penetrated into the lower portions of the patterns on the substrate W. In addition, the rinse liquid C4 having the low surface tension may penetrate to all of the edge regions of the spaces formed by the patterns on the substrate W. Accordingly, the rinse liquid C4 which has penetrated to the lower portions of the patterns and to the edge regions of the spaces formed by the patterns and the treatment liquid C1 are mixed with each other, so that the treatment liquid C1 may evenly penetrate to the lower portions of the patterns and to the edge regions of the patterns. That is, as illustrated in FIG. 14, the treatment liquid C1 may penetrate up to the region where the particles P that have not removed in the prior removal operation S10 are located.

Figure 15:
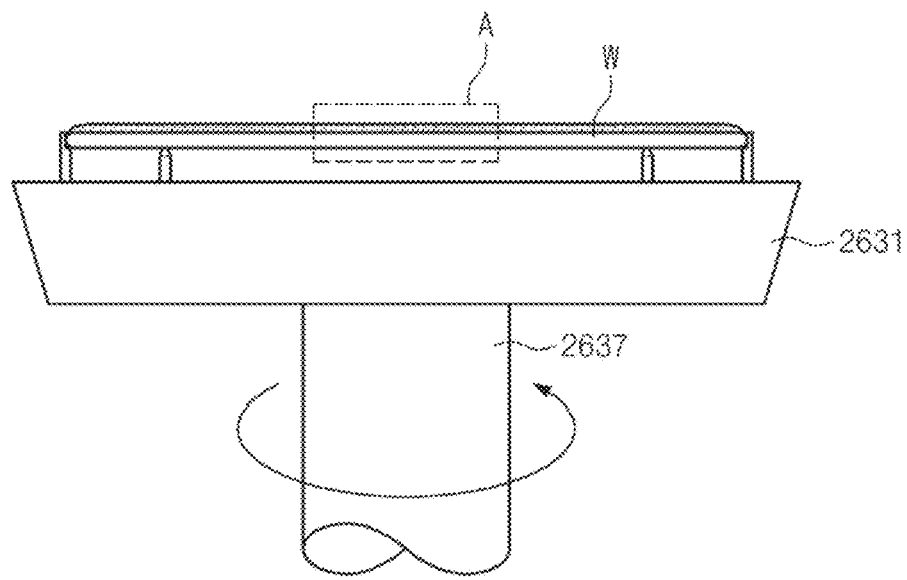
FIG. 15 is a diagram schematically illustrating a state in which the substrate is rotated to form a liquid film in the post removal operation of FIG. 3.
Figure 16:
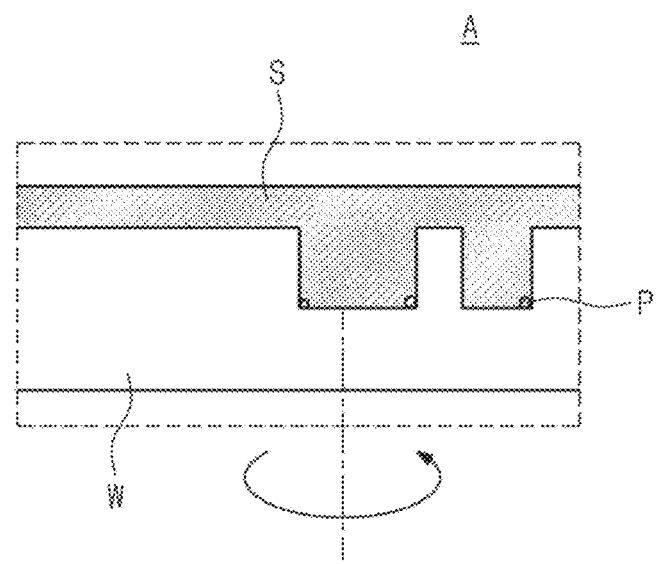
FIG. 16 is a diagram schematically illustrating an enlarged state of part A of FIG. 15.

FIG. 15 is a diagram schematically illustrating a state in which the substrate is rotated to form the liquid film in the post removal operation of FIG. 3, and FIG. 16 is a diagram schematically illustrating an enlarged state of part A of FIG. 15.

Referring to FIG. 15, in the liquid film formation operation S22 in the post removal operation S20, the support unit 2830 is rotated. As the support unit 2830 rotates, the substrate W supported by the support unit 2830 also rotates. In the liquid film formation operation S22, the substrate W may rotate at a speed of 1500 rpm. In the liquid film formation operation S22, the liquid supply unit 2640 may be located at the standby position. In the liquid film formation operation S22, the substrate W is rotated to volatilize the solvent between the polymer and the solvent included in the treatment liquid C1 supplied onto the substrate W.

Referring to FIG. 16, the liquid film S of the solidified treatment liquid C1 is formed on the substrate W by rotating the substrate W to volatilize the solvent. As the solvent volatilizes in the treatment liquid C1, volume shrinkage occurs, and the treatment liquid C1 is solidified. As the volume of the treatment liquid C1 shrinks, particles in the pattern formed on the substrate W and particles P deposited on the upper surface of the pattern may be capture in the liquid film S of the treatment liquid C1. As illustrated in FIG. 16, particles P that are not removed from the lower portions of the patterns and the edge regions of the patterns during the prior removal operation S10 may be captured in the liquid film S.

Figure 17:
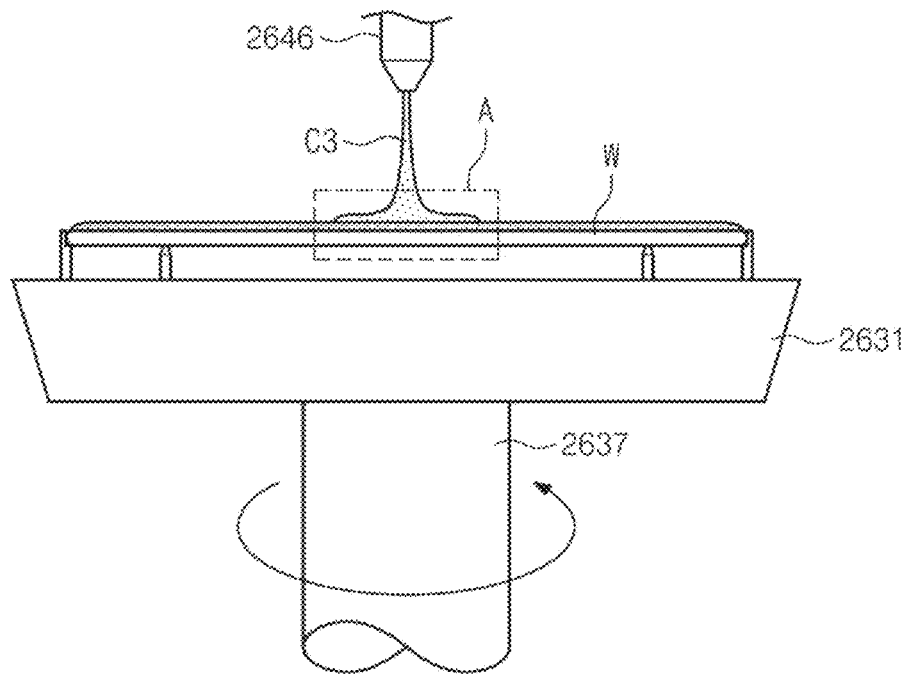
FIG. 17 is a diagram schematically illustrating a state in which a second stripping liquid is supplied to the substrate in the post removal operation of FIG. 3.
Figure 18:
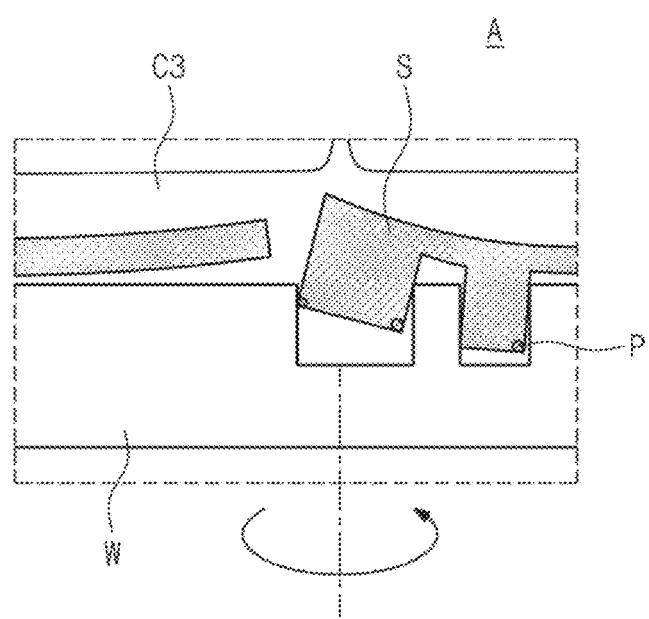
FIG. 18 is a diagram schematically illustrating an enlarged state of part A of FIG. 17.

FIG. 17 is a diagram schematically illustrating a state in which the second stripping liquid is supplied to the substrate in the post removal operation of FIG. 3, and FIG. 18 is a diagram schematically illustrating an enlarged state of part A of FIG. 17.

Referring to FIG. 17, in the stripping operation S23 in the post removal operation S20, the second stripping liquid C3 may be supplied to the substrate W supported by the support unit 2830. In addition, in the stripping operation S23, the second stripping liquid C3 may be supplied to the substrate W rotated by the support unit 2830. In the stripping operation S23, the second stripping liquid supply nozzle 2646 discharges the second stripping liquid C3 to the substrate W. As described above, in the stripping operation S23, the substrate W may rotate at a speed of 1000 rpm. According to the example, the second stripping liquid C3 may be provided with a hydrogen peroxide solution ($H_2O_2$). Optionally, the second stripping liquid C3 may be provided with a mixed solution of a hydrogen peroxide solution ($H_2O_2$) and deionized water (DIW).

In the stripping operation S23, the second stripping liquid supply nozzle 2646 may supply the second stripping liquid C3 from the top of the substrate W to the center of the substrate W. For example, the center of the second stripping liquid supply nozzle 2646 may coincide with the center of the substrate W when viewed from the top. As the substrate W is rotated, the second stripping liquid C3 discharged to the central region of the substrate W may flow toward the edge region of the substrate W.

Referring to FIG. 18, the second stripping liquid C3 may flow to the substrate W on which the pattern is formed. The liquid film S formed on the substrate W may be stripped off from the substrate W by the second stripping liquid C3. Since the second stripping liquid C3 is provided with a hydrogen peroxide solution ($H_2O_2$) or the mixed solution of a hydrogen peroxide solution ($H_2O_2$) and deionized water (DIW), the oxidizing power is relatively higher than that of the first stripping liquid C2. Accordingly, the second stripping liquid C3 may make the surface of the substrate W hydrophilic. Accordingly, the second stripping liquid C3 may easily penetrate into the space between the liquid film S of the solidified treatment liquid C1 and the substrate W. As the second stripping liquid C3 easily penetrates between the liquid film S and the substrate W, the liquid film S may be easily stripped off the substrate W. The second stripping liquid C3 increases the efficiency in which the liquid film S collecting the particles P is stripped off from the substrate W.

Figure 19:
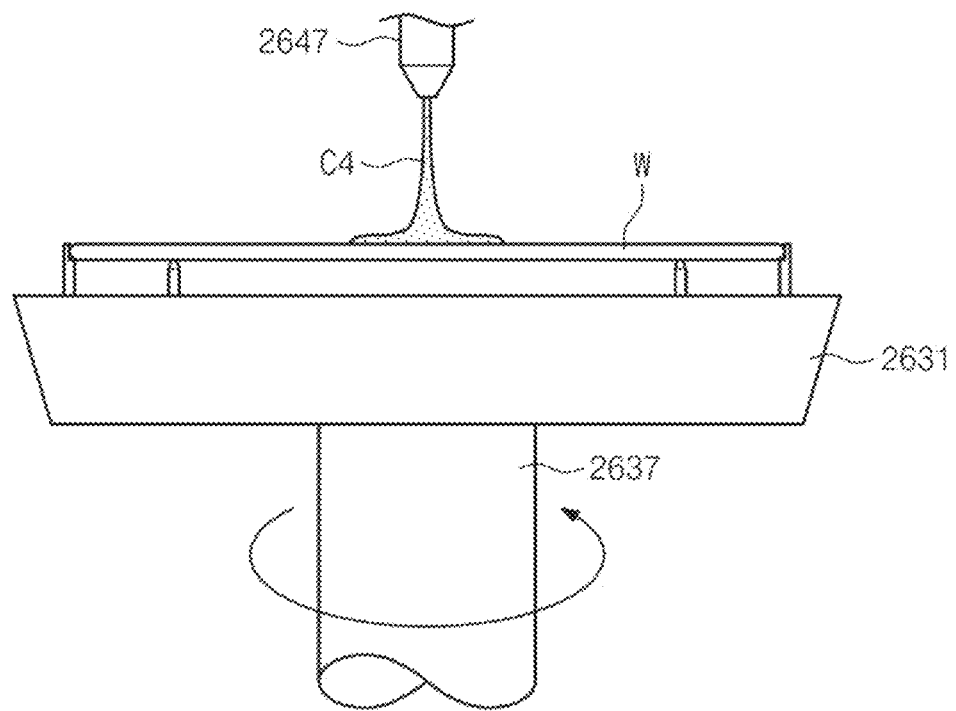
FIG. 19 is a diagram schematically illustrating a state in which a rinse liquid is supplied to the substrate in the post removal operation of FIG. 3.

FIG. 19 is a diagram schematically illustrating a state in which the rinse liquid is supplied to the substrate in the post removal operation of FIG. 3. Referring to FIG. 19, in the rinsing operation S24 in the post removal operation S20, the rinse liquid C4 may be supplied to the substrate W supported by the support unit 2830. Also, in the rinsing operation S24, the rinse liquid C4 may be supplied to the substrate W rotated by the support unit 2830. As described above, in the rinsing operation S24, the substrate W may rotate at a speed of 500 rpm. The rinse liquid C4 may be an organic solvent. According to one example, the rinse liquid C4 may be isopropyl alcohol.

In the rinsing operation S14, the rinse liquid supply nozzle 2647 may supply the rinse liquid C4 from the upper portion of the substrate W to the center of the substrate W. For example, the center of the rinse liquid supply nozzle 2647 may coincide with the center of the substrate W when viewed from the top. As the substrate W is rotated, the rinse liquid C4 discharged to the central region of the substrate W may flow toward the edge region of the substrate W. The rinse liquid C4 discharged onto the substrate W may remove the residue of the liquid film S that is not completely removed from the substrate W. The liquid film S removed by the rinse liquid C4 may be washed out of the substrate W by the rotation of the substrate W. In addition, the rinse liquid C4 may replace the first stripping liquid C1 present on the substrate W. Accordingly, the surface of the substrate W may be dried by the highly volatile rinse liquid C4.

In the drying operation S30, after the post removal operation S20 is completely performed, the substrate W is rotated at a high speed to volatilize the liquid remaining on the substrate W by centrifugal force to dry the substrate W. The drying operation S30 may be performed in the process chamber 260. Also, the drying operation S30 may be performed in a chamber provided separately from the process chamber 260.

In the above-described exemplary embodiments of the present invention, the case where the treatment liquid C1 is supplied to the substrate W in the prior removal operation S10 and then the solvent is volatized by immediately rotating the substrate W, but the present invention is not limited thereto. For example, after the treatment liquid supply operation S11 of supplying the treatment liquid C1 to the substrate W, the substrate W may be rotated while heating the treatment liquid C1 supplied onto the substrate W. For example, when the treatment liquid C1 is heated, inert gas may be supplied to the substrate W to which the treatment liquid C1 is supplied. In this case, the volatilization amount of the solvent included in the treatment liquid C1 supplied onto the substrate W may increase. This method may be performed in the same manner even after supplying the treatment liquid C1 to the substrate W in the post removal operation S20.

The foregoing detailed description illustrates the present invention. Further, the above content shows and describes the exemplary embodiment of the present invention, and the present invention can be used in various other combinations, modifications, and environments. That is, changes or modifications are possible within the scope of the concept of the invention disclosed herein, the scope equivalent to the written disclosure, and/or within the scope of skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating method, comprising:
   a prior removal operation of removing contaminants formed on the substrate; and
   a post removal operation of further removing residual contaminants remaining on the substrate after the prior removal operation,
   wherein each of the prior removal operation and the post removal operation includes:
   a treatment liquid supply operation of supplying a treatment liquid including a polymer and a solvent onto the substrate;

a solidified liquid film formation operation of forming a solidified liquid film by volatilizing the solvent in the treatment liquid;

a stripping operation of supplying a stripping liquid onto the substrate to remove the solidified liquid film from the substrate; and a rinsing operation of supplying a rinse liquid to the substrate to clean the substrate, wherein the treatment liquid supply operation of the post removal operation includes supplying the treatment liquid to the substrate that is coated with the rinse liquid supplied in the prior removal operation, and a surface tension of the rinse liquid is lower than a surface tension of the treatment liquid.

2. The substrate treating method of claim 1, wherein the rinse liquid is isopropyl alcohol.

3. The substrate treating method of claim 1, wherein the stripping liquid in the prior removal operation includes deionized water, and the stripping liquid in the post removal operation includes a hydrogen peroxide solution or a mixed solution of a hydrogen peroxide solution and deionized water.

4. The substrate treating method of claim 3, wherein in the treatment liquid supply operation of the prior removal operation, the treatment liquid is supplied to the substrate rotating at a first speed, and in the treatment liquid supply operation of the post removal operation, the treatment liquid is supplied to the substrate rotating at a second average speed lower than the first speed, and a rotation speed of the substrate is changed from a third speed lower than the second average speed to the first speed while the treatment liquid is supplied to the substrate.

5. A substrate treating method for removing particles formed on a substrate, the substrate treating method comprising:

performing a first process of supplying a first treatment liquid including a polymer and a solvent onto the substrate rotating at a first speed;

forming a first solidified liquid film by volatilizing the solvent in the first treatment liquid;

removing the first solidified liquid film from the substrate by supplying a first stripping liquid onto the substrate;

supplying a first rinse liquid onto the substrate; and performing a second process of supplying a second treatment liquid including a polymer and a solvent onto the substrate in a state in which the substrate is coated with the first rinse liquid, wherein a surface tension of the first rinse liquid is lower than a surface tension of the second treatment liquid.

6. The substrate treating method of claim 5, wherein the substrate is rotated during the first process and during the second process.

7. The substrate treating method of claim 5, wherein in the first process, the first treatment liquid is supplied to the substrate rotating at the first speed, and in the second process, the second treatment liquid is supplied to the substrate rotating at a second average speed lower than the first speed.

8. The substrate treating method of claim 7, wherein a rotation speed of the substrate is changed from a third speed that is lower than the second average speed to the first speed while the second treatment liquid is supplied to the substrate in the second process.

9. The substrate treating method of claim 8, further comprising:

forming a second solidified liquid film by volatilizing the solvent in the second treatment liquid;

removing the second solidified liquid film from the substrate by supplying a second stripping liquid onto the substrate; and supplying a second rinse liquid onto the substrate, wherein the second stripping liquid includes a hydrogen peroxide solution or a mixed solution of a hydrogen peroxide solution and deionized water.

10. The substrate treating method of claim 9, wherein the first stripping liquid includes deionized water.

11. The substrate treating method of claim 9, wherein the first stripping liquid and the second stripping liquid are different from each other.

12. The substrate treating method of claim 9, wherein the first rinse liquid and the second rinse liquid are isopropyl alcohol.

* * * * *